(12) United States Patent
Chang et al.

(10) Patent No.: US 8,895,234 B2
(45) Date of Patent: *Nov. 25, 2014

(54) IMMERSION LITHOGRAPHY WATERMARK REDUCTION

(71) Applicant: Taiwan Semiconductor Manufacturing Company, Ltd., Hsin-Chu (TW)

(72) Inventors: Ching-Yu Chang, Yilang (TW); Vincent Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/760,306

(22) Filed: Feb. 6, 2013

(65) Prior Publication Data

US 2013/0309611 A1 Nov. 21, 2013

Related U.S. Application Data

(63) Continuation of application No. 11/427,017, filed on Jun. 28, 2006, now Pat. No. 8,383,322.

(60) Provisional application No. 60/705,795, filed on Aug. 5, 2005.

(51) Int. Cl.
G03F 7/26 (2006.01)

(52) U.S. Cl.
USPC .......................................... 430/325; 430/311

(58) Field of Classification Search
USPC .................................................. 430/311, 322
See application file for complete search history.

(56) References Cited

U.S. PATENT DOCUMENTS

| 5,212,047 A | 5/1993 | Hertler et al. |
| 5,658,706 A | 8/1997 | Nniki et al. |
| 6,153,349 A | 11/2000 | Ichikawa et al. |
| 6,713,236 B2 | 3/2004 | Chen |
| 6,781,670 B2 | 8/2004 | Krautschik |

(Continued)

FOREIGN PATENT DOCUMENTS

| CN | 1235281 | 11/1999 |
| CN | 1407405 | 2/2003 |

(Continued)

OTHER PUBLICATIONS

Chinese Patent Office, Office Action of May 12, 2010, Application No. 200910150015.5, 5 pgs.

(Continued)

*Primary Examiner* — Kathleen Duda
(74) *Attorney, Agent, or Firm* — Haynes and Boone, LLP

(57) ABSTRACT

Provided is a method of performing a lithography process. The method includes: exposing, through an immersion lithography process, a photo-sensitive material on a substrate, the immersion lithography process using a fluid for the exposing; thereafter treating the photo-sensitive material with a solution to neutralize quenchers that have diffused into the photo-sensitive material through the liquid, wherein the solution contains a substance that diffuses into the photo-sensitive material at a first rate that is dependent on a second at which the quenchers diffuse into the photo-sensitive material; thereafter removing a portion of the photo-sensitive material; thereafter performing a post-exposure bake to the photo-sensitive material; and developing the photo-sensitive material.

20 Claims, 2 Drawing Sheets

(56) References Cited

U.S. PATENT DOCUMENTS

| | | |
|---|---|---|
| 6,788,477 B2 | 9/2004 | Lin |
| 6,828,079 B2 | 12/2004 | Suetsugu et al. |
| 6,849,378 B2 | 2/2005 | Choi et al. |
| 6,929,891 B2 | 8/2005 | Rushkin et al. |
| 7,264,918 B2 | 9/2007 | Endo et al. |
| 7,927,779 B2 | 4/2011 | Chang et al. |
| 8,202,680 B2 | 6/2012 | Chang |
| 8,383,322 B2 * | 2/2013 | Chang et al. .............. 430/311 |
| 2003/0186161 A1 | 10/2003 | Fujimori |
| 2004/0224257 A1 | 11/2004 | Shibuya |
| 2004/0259029 A1 | 12/2004 | Nagahara et al. |
| 2004/0259373 A1 | 12/2004 | Nagahara et al. |
| 2004/0265747 A1 | 12/2004 | Medeiros et al. |
| 2005/0007570 A1 | 1/2005 | Streefkerk et al. |
| 2005/0029492 A1 | 2/2005 | Subawalla et al. |
| 2005/0036183 A1 | 2/2005 | Yeo et al. |
| 2005/0051930 A1 | 3/2005 | Kawakami et al. |
| 2005/0084794 A1 | 4/2005 | Meagley et al. |
| 2005/0106499 A1 | 5/2005 | Harada et al. |
| 2005/0202340 A1 | 9/2005 | Houlihan et al. |
| 2005/0202351 A1 | 9/2005 | Houlihan et al. |
| 2005/0221234 A1 | 10/2005 | Ito |
| 2005/0243291 A1 | 11/2005 | Kim |
| 2005/0255414 A1 | 11/2005 | Inabe et al. |
| 2005/0277056 A1 | 12/2005 | Kim et al. |
| 2006/0007419 A1 | 1/2006 | Streefkerk et al. |
| 2006/0008747 A1 | 1/2006 | Kawamura et al. |
| 2006/0068318 A1 | 3/2006 | Meagley et al. |
| 2006/0111550 A1 | 5/2006 | Hata et al. |
| 2006/0154170 A1 | 7/2006 | Endo et al. |
| 2007/0002296 A1 | 1/2007 | Chang |
| 2007/0006405 A1 | 1/2007 | Feng |
| 2007/0016639 A1 | 1/2007 | Mukundan et al. |
| 2007/0031760 A1 | 2/2007 | Chang et al. |
| 2007/0077517 A1 | 4/2007 | Chang |
| 2008/0076038 A1 | 3/2008 | Chang |

FOREIGN PATENT DOCUMENTS

| | | |
|---|---|---|
| EP | 1033624 | 9/1999 |
| EP | 1522894 | 4/2005 |
| EP | 1601008 | 11/2005 |
| JP | 07134419 | 5/1995 |
| JP | 07146558 | 6/1995 |
| JP | 201109142 | 4/1997 |
| JP | 09160244 | 6/1997 |
| JP | 2001337448 | 7/2001 |
| JP | 2003140360 | 5/2003 |
| JP | 2003167345 | 6/2003 |
| JP | 2005101487 | 9/2003 |
| JP | 2005081302 | 3/2005 |
| JP | 2005101498 | 4/2005 |
| JP | 2005128455 | 5/2005 |
| JP | 2005157259 | 6/2005 |
| JP | 2005264131 | 9/2005 |
| JP | 200624692 | 1/2006 |
| JP | 2006276851 | 10/2006 |
| JP | 2007304545 | 11/2007 |
| TW | 200613433 | 5/2006 |
| WO | WO-02/91084 | 5/2002 |
| WO | WO-2004/079800 | 9/2004 |
| WO | WO-2004/081666 | 9/2004 |
| WO | WO-2004/088429 | 10/2004 |
| WO | WO-2005/013007 | 2/2005 |
| WO | WO-2005/019937 | 3/2005 |
| WO | WO-2005/024325 | 3/2005 |
| WO | WO-2005/081063 | 9/2005 |
| WO | WO-2005/088397 | 9/2005 |

OTHER PUBLICATIONS

Japanese Patent Office, Office Action of Nov. 24, 2009, Application No. 2007-146915, 12 pgs.

Chinese Patent Office, Office Action of Dec. 11, 2009, Application No. 2006101524283, 63 pgs.

Japanese Patent Office, Office Action of Jul. 6, 2009, Application No. 2006-212576. 4 pgs (English translation 3 pgs.).

Israeli Patent Office, Office Action of Feb. 9, 2010, Application No. 178317, 2 pgs. (English translation, 2 pgs.).

French Patent Office, Office Action of Jun. 22, 2010, Application No. 0608609, 8 pgs.

Taiwanese Patent Office, Office Action of Mar. 2, 2011, Application No. 096114844. 5 pgs.

Taiwanese Patent Office, Office Action of Nov. 24, 2010, Application No. 095128606, 4 pgs.

Japanese Office Action, Office Action of Nov. 9, 2009, Application No. 2006-212576, 2 pgs.

German Patent Office, Office Action of Apr. 15, 2009, Application No. 10-2006-046453.2-51, 8 pgs. (English translation 9 pgs.).

Chinese Patent Office, Office Action of Jun. 26, 2009, Application No. 2006-101524283, 4 pgs.

Chinese Patent Office, Office Action of May 22, 2009, Application No. 2006-101524298, 5 pgs.

Jung, et al., "Top Antireflective Coating Process for Immersion Lithography," Advances in Resist Technology and Processing, XXII, Proceedings of SPIE vol. 5753, Bellingham, WA, p. 519-526, 2005.

European Patent Office, Novelty Search Report of Apr. 10, 2007, Dutch Application No. 1032276, 11 pgs.

Japanese Patent Office, Notification of Reasons for Refusal of Jan. 13, 2009, Application No. 2006-186,926, 12 pgs.

European Patent Office, Novelty Search Report of Jun. 28, 2006, Dutch Application No. 1032068, 5 pgs.

* cited by examiner

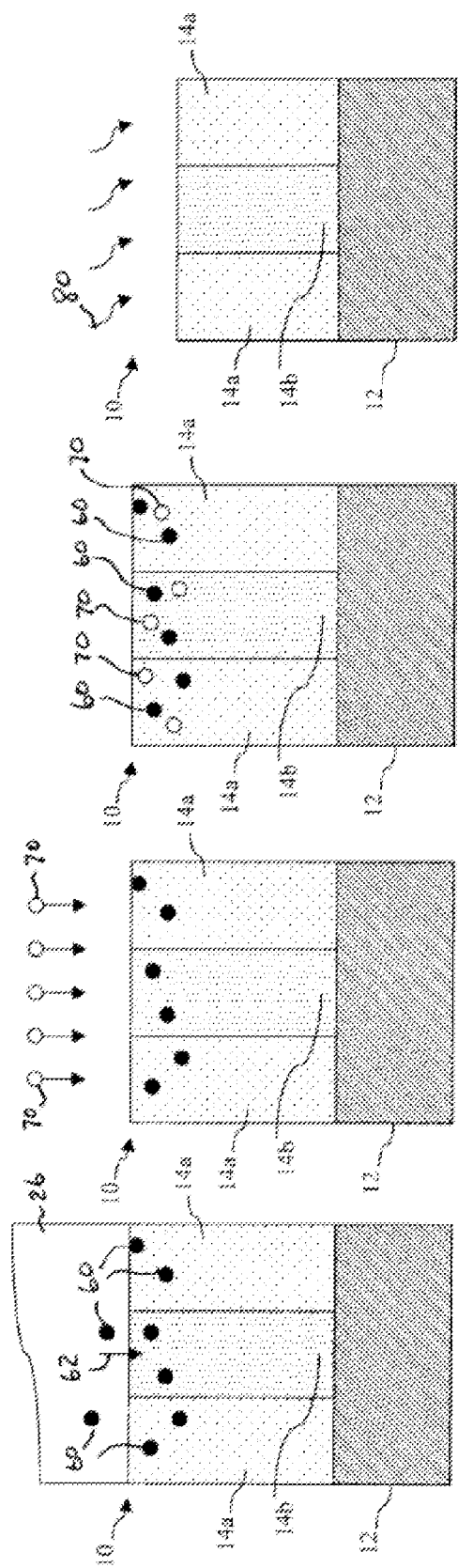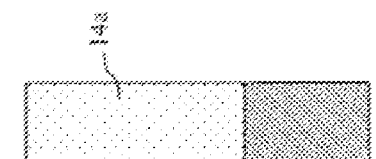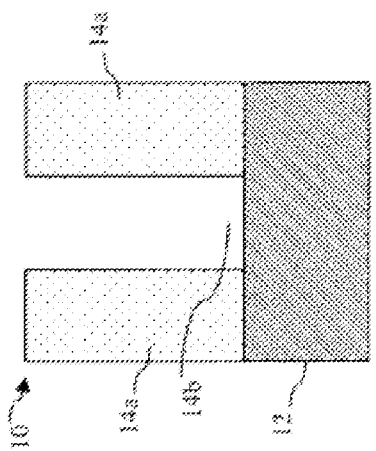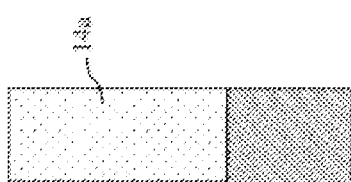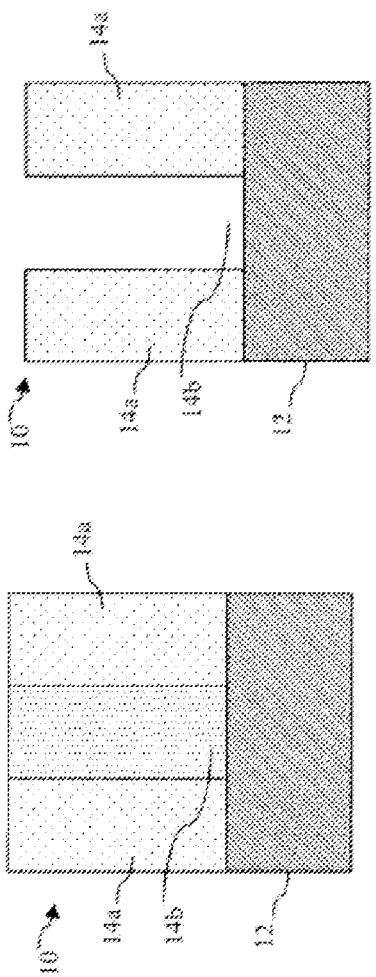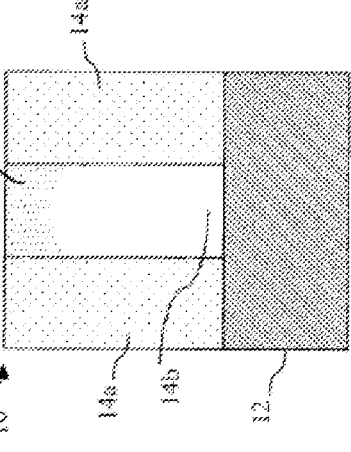

IMMERSION LITHOGRAPHY WATERMARK REDUCTION

PRIORITY DATA

This application is a Continuation Application of Ser. No. 11/427,017, filed on Jun. 28, 2006, entitled "IMMERSION LITHOGRAPHY WATERMARK REDUCTION," which is the Utility Application of Provisional Patent Application No. 60/705,795 filed Aug. 5, 2005 entitled, "IMMERSION LITHOGRAPHY WATERMARK REDUCTION," the disclosures of each which are hereby incorporated by reference in their entirety.

BACKGROUND

The present disclosure relates generally to immersion lithography, such as is used in the manufacture of semiconductor integrated circuits.

This application is related to U.S. application Ser. No. 11/271,639 filed Nov. 10, 2005 entitled "Water Mark Defect Prevention for Immersion Lithography," which claims priority to U.S. application Ser. No. 60/722,646 filed Sep. 30, 2005; U.S. application Ser. No. 11/324,588 filed Jan. 3, 2006 entitled, "Novel TARC Material for Immersion Watermark Reduction", which claims priority to U.S. Application Nos. 60/722,316 filed Sep. 30, 2005 and 60/722,646 filed Sep. 30, 2005; and U.S. application Ser. No. 11/384,624 filed Mar. 20, 2006 entitled, "Immersion Lithography Defect Reduction", which claims priority to U.S. Application No. 60/695,562 filed Jun. 30, 2005.

Lithography is a mechanism by which a pattern on a mask is projected onto a substrate such as a semiconductor wafer. In areas such as semiconductor photolithography, it has become necessary to create images on the semiconductor wafer which incorporate minimum feature sizes under a resolution limit or critical dimension (CD). Currently, CDs are reaching 65 nanometers and less.

Semiconductor photolithography typically includes the steps of applying a coating of photoresist on a top surface (e.g., a thin film stack) of a semiconductor wafer and exposing the photoresist to a pattern. A post-exposure bake is often performed to allow the exposed photoresist, often a polymer-based substance, to cleave. The cleaved polymer photoresist is then transferred to a developing chamber to remove the exposed polymer, which is soluble to an aqueous developer solution. As a result, a patterned layer of photoresist exists on the top surface of the wafer.

Immersion lithography is a new advance in photolithography, in which the exposure procedure is performed with a liquid filling the space between the surface of the wafer and the lens. Using immersion photolithography, higher numerical apertures can be built than when using lenses in air, resulting in improved resolution. Further, immersion provides enhanced depth-of-focus (DOF) for printing ever smaller features.

The immersion exposure step may use de-ionized water or another suitable immersion exposure fluid in the space between the wafer and the lens. Though the exposure time is short, the fluid can cause heretofore unforeseen problems. For example, droplets from the fluid can remain after the process and can adversely affect the patterning, critical dimensions, and other aspects of the resist.

Efforts have been made to reduce the occurrence of droplets on the wafer. One example is to provide a drying process immediately after the exposure, such as is described in the presently incorporated Provisional Application No. 60/695, 562 filed Jun. 30, 2005. However, the drying process must occur very quickly, e.g., within a few minutes, to prevent some types of damage. Sometimes it is difficult to ensure that the drying process is done in a sufficiently quick amount of time.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3, 4, and 6-10 are side cross sectional views of a semiconductor wafer that is undergoing a post-immersion lithography treatment process.

DETAILED DESCRIPTION

The present disclosure relates generally to the fabrication of semiconductor devices, and more particularly, to a method and system for preventing defects in a semiconductor substrate. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and clarity, and such repetition does not indicate any required combination of features or steps throughout the drawings.

Figure 1:
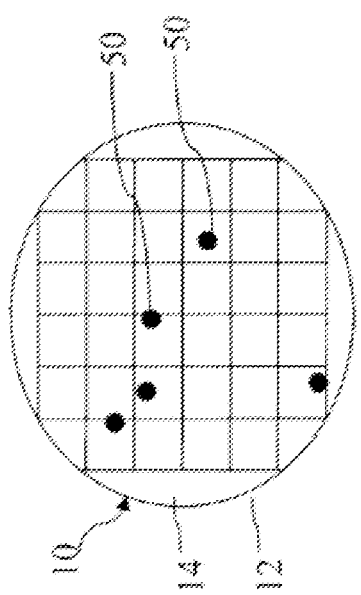
FIG. 1 is a top view of a semiconductor wafer that is suffering from one or more defects.

Referring to FIG. 1, a semiconductor wafer 10 includes a substrate 12 and a patterning layer 14. The substrate 12 can include one or more layers, including poly, metal, and/or dielectric, that are desired to be patterned. In the present example, the patterning layer 14 is a polymer photoresist (resist) layer that is responsive to an exposure process for creating patterns. The resist 14 includes a photo acid generator (PAG) to support a chemical amplifier (CA) reaction (CAR). CAR supports deep ultraviolet (UV) and deep submicron technologies. During lithography, a photon induces decomposition of PAG and forms a small amount of acid. The formed acid induces a cascade of chemical transformations in the resist film, typically during a post-exposure bake step. It is understood that there are many other examples of resist, including those with a photo base generator (PBG). Also, whether the resist 14 is positive resist or negative resist is a matter of design choice, but for the sake of further example, a positive resist will be desired.

Figure 2:
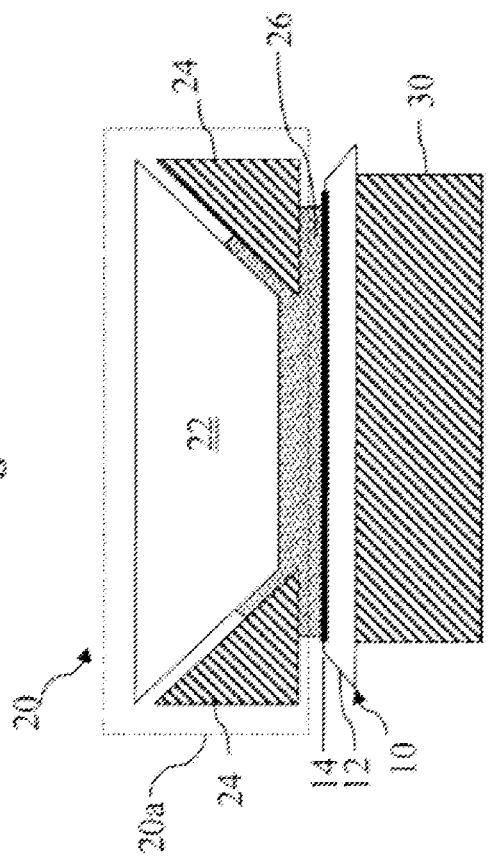
FIG. 2 is a side-view cross sectional diagram of an immersion lithography system.

Referring to FIG. 2, the patterns on the photoresist layer 14 can be created by an immersion lithography system 20. The immersion lithography system includes a lens system 22, a structure 24 for containing a fluid 26 such as de-ionized water, various apertures 28 through which fluid can be added or removed, and a chuck 30 for securing and moving the wafer 10 relative to the lens system 22. The fluid containing structure 24 and the lens system 22 make up an immersion head 20a. The immersion head 20a can use some of the apertures as an "air purge," which can add air towards the wafer for drying, and other apertures for removing any purged fluid. The air purge alone may be insufficient to purge all of the fluid 26 from the wafer 10, and droplets often remain.

Referring again to FIG. 1, the wafer 10 is shown after going through a conventional immersion lithography process. The wafer 10 includes defects 50 that have been caused during the process. The defects 50 represent damage resulting from droplets remaining from the immersion lithography fluid 26 (FIG. 2), and may include deformation or "holes" (missing patterns) in the resist. Other types of defects may also exist.

Referring to FIG. 3, a fault mechanism for causing defects can be that quenchers 60, which exist in the resist 14 to stop the CAR, leach into the fluid 26. The resist of FIG. 3 is shown to include two unexposed portions of resist, labeled 14a, and an exposed portion of resist, labeled 14b. The quenchers 60 then diffuse into the exposed resist 14, which adversely affects pattern formation in a subsequent post-exposure bake (PEB) and developing process.

Referring to FIG. 4, an example of a defect caused by the above-described leaching and diffusing of the quenchers 60 is that of the undesired resist, labeled 14c, which may exist after the PEB and developing process. (A desired pattern is illustrated in FIG. 10). In furtherance of the present example, the diffused quenchers will stop or significantly reduce photo acid generation (PAG) in a chemical amplify reaction (CAR), such as during post-exposure bake (PEB). This makes the resist less-soluble and less likely to react with a developing solution such as aqueous tetramethyl ammonium hydroxide (TMAH). In the example of FIG. 4, the resist 14c forms a scrum/bridge profile, thereby adversely affecting a desired pattern.

Figure 5:
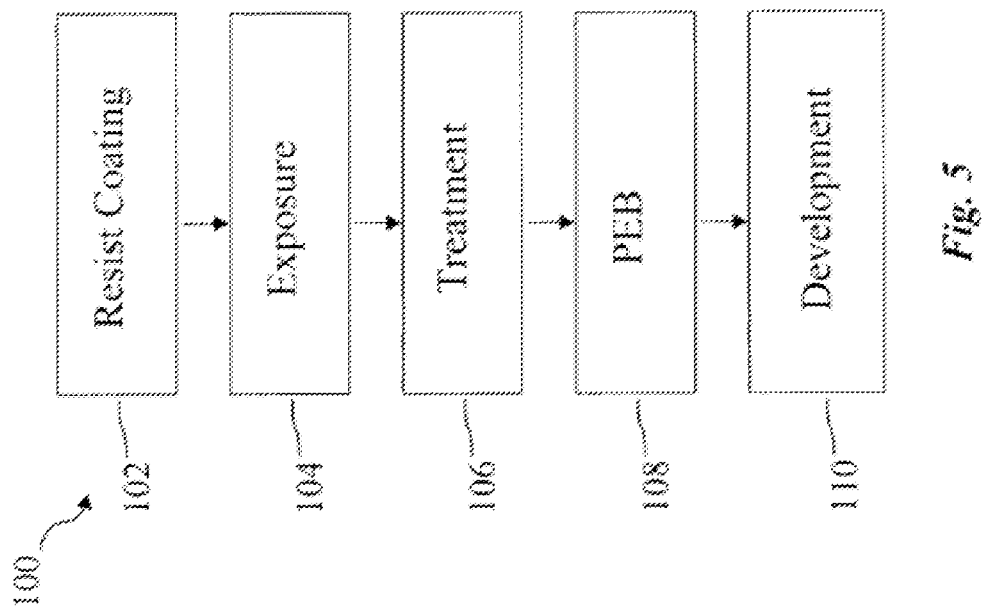
FIG. 5 is a flow chart of a method for implementing an immersion lithography process with reduced defects, according to one or more embodiments of the present invention.

Referring to FIG. 5, a simplified flowchart of an embodiment of a method for immersion lithography with a reduced number of defects is designated with the reference numeral 100. In step 102, the resist 14 is formed over the surface of the wafer substrate 12. The resist 14 may be a negative or positive resist and may be of a material now known or later developed for this purpose. For example, the resist 14 may be a one- two- or multi-component resist system. The application of the resist 14 may be done with spin-coating or another suitable procedure. Prior to the application of the resist 14, the wafer 10 may be first processed to prepare it for the photolithography process. For example, the wafer 10 may be cleaned, dried and/or coated with an adhesion-promoting material prior to the application of the resist 14.

At step 104, an immersion lithography exposure is performed. The wafer 10 and resist 14 are immersed in the immersion exposure liquid 26 and exposed to a radiation source through the lens 22 (FIG. 2). The radiation source may be an ultraviolet light source, for example a krypton fluoride (KrF, 248 nm), argon fluoride (ArF, 193 nm), or F2 (157 nm) excimer laser. The resist 14 is exposed to the radiation for a predetermined amount of time, dependent on the type of resist used, the intensity of the ultraviolet light source, and/or other factors. The exposure time may last from about 0.2 seconds to about 30 seconds, for example. The exposure results in portions of the resist 14 being solidify, while other portions remaining in a fluid state.

At step 106, a treatment process is performed. The treatment process may be performed in-situ with the previous or next processing step, or may be performed in a separate chamber. There are several unique treatment processes that can by used to help reduce the problems discussed above. These processes can be used individually or in various combinations.

Referring to FIG. 6, in one embodiment, a quencher-neutralizing solution 70 is provided to a top surface of the resist 14 (the surface which was previously exposed to the immersion fluid 26). The solution 70 can vary based on the type of resist and/or the diffusion depth of the quenchers 60. In one example, the solution is a liquid of opposite polarity of the quencher 60. The solution 70 can also be a vapor, or a combination of liquid and vapor. For example, if the quencher 60 is basic (pH>7), the solution 70 will be acidic (pH<7). In furtherance of the example, the solution 70 can include H+ such as HCl. The HCl solution can have a pH between around 1-3. In another example, the solution 70 can include a PAG. In a third example, the solution 70 can include a buffer such as H3PO4+KH2PO4.

It is understood that in the present example, the resist 14 includes a basic quencher and a photo acid generator (PAG). In another example, the resist 14 may include an acidic quencher and a photo base generator (PBG). In this latter example, the solution 70 will be basic (pH>7). Therefore, one of skilled in the art will understand that many different types of solutions can be used, depending on various factors such as the type of resist 14 being used. Other factors are discussed below.

Referring to FIG. 7, the solution 70 diffuses into the resist 14 and reacts with the quenchers 60. In one embodiment, it is desired to have the solution 70 diffuse to a relatively shallow depth (e.g., to improve the interaction with the quenchers 60 which are at the shallow depth). In this embodiment, different types of solution 70 can be chosen. For example, the HCl solution discussed above can have a relatively high molar concentration (e.g., greater than or equal to about 0.1 moles). Also, "larger" acid molecules, such as H3PO4, would have a reduced diffusion depth, as compared to the "smaller" acid molecules like HCl. The larger molecules may be desirable due to their reduced diffusion rate into the resist. Further still, temperature and/or pressure can be modified to control the diffusion rate.

Referring to FIG. 8, in another embodiment (or in addition to one of the previous embodiments), a surface reduction mechanism 80 can be used to remove the diffused quenchers 60 (FIG. 3). The surface reduction mechanism 80 can be a solvent rinse for removing a thin layer of the top surface of the resist 14. In one embodiment, the thin layer is about 100 Angstroms thick. The thickness of the removed layer can change based upon how deep the quenchers 60 have diffused. The solvent may be propylene monomethyl ether (PGME), or propylene glycol monomethyl etheracetate (PGMEA). Other solvents can be used, depending on the type of resist 14 and/or the diffusion depth of the quenchers 60 (similar to the discussion above with respect to the solution 70).

Referring to FIG. 9, as a result, the quenchers 60 near the top surface of the resist 14 (specifically the upper portion of resist 14b) have been neutralized and/or removed by one or more of the above-described methods.

In some embodiments, a deionized (DI) water rinse 90 and a spin dry process can be performed after the quenchers 60 have been removed and/or neutralized. The DI water 90 is less likely to experience leaching of the quenchers 60 since the quenchers near the top surface of the resist 14 have been removed and/or neutralized. Also, the rinse/dry step can be performed very close in time (e.g., less than 2 minutes) before the post-exposure bake (PEB, discussed below) so that very little leaching, if any, will occur.

Referring again to FIG. 5, at step 108, the wafer 10 with the exposed and treated resist 14 is then heated for a post-exposure bake (PEB) for polymer dissolution. This step lets the generated photo acid (or base) to react with the polymer and facilitate the polymer dissolution. The wafer may be heated to a temperature of about 85 to about 150° C. for about 30 to about 200 seconds, for example.

At step 110, a pattern developing process is performed on the exposed (positive) or unexposed (negative) resist 14 to leave the desired mask pattern. In some embodiments, the wafer 10 is immersed in a developer liquid for a predetermined amount of time during which a portion of the resist 14 is dissolved and removed. The wafer 10 may be immersed in the developer solution for about 5 to about 60 seconds, for example. The composition of the developer solution is dependent on the composition of the resist 14, and is understood to be well known in the art. TMAH, as discussed above, is one example of a developer solution.

Referring to FIG. 10, as a result, a desired pattern is produced in the resist 14, with reduced defects (such as the scrum/bridge of resist 14c shown in FIG. 4).

Although only a few exemplary embodiments of this invention have been described in detail above, those skilled in the art will readily appreciate that many modifications are possible in the exemplary embodiments without materially departing from the novel teachings and advantages of this invention. For example, the wafer 10 may rotate or remain static during the liquid treatment. Also, the solution 70 and/or the reducing mechanism 80 can include supercritical fluids or other solvents.

In one embodiment, a method is provided for performing immersion lithography on a semiconductor substrate. The method includes providing a layer of resist onto a top surface of the semiconductor substrate and exposing the resist layer using an immersion lithography exposure system. The method also includes treating the resist layer after exposure and before a post-exposure bake, the treatment neutralizing quenchers that have diffused into the resist through a fluid used during exposure. Afterwards, a post-exposure bake and a developing process are performed on the exposed and treated resist layer.

In some embodiments, the treatment step utilizes a rinse solution including a substance having a polarity selected for neutralizing the quenchers diffused into the resist. The substance can be acidic for neutralizing basic quenchers, and vice versa. The substance can be selected on the basis of diffusion rate to correspond with a diffusion rate of the quenchers into the resist.

In some embodiments, a neutral-solution (e.g., deionized water) rinse and spin dry are performed after the treatment and prior to the post exposure bake.

In some embodiments, the treatment step utilizes a vapor solution, the vapor solution having a polarity selected for neutralizing the quenchers diffused into the resist.

In some embodiments, the treatment step utilizes a solvent. The solvent removes a thin upper portion of the resist layer, for example about 100 Angstroms in thickness.

In another embodiment, a method of treating a semiconductor wafer after an immersion lithography process has exposed a pattern on a resist layer of the wafer is provided. The method includes applying a rinse to the resist layer of the semiconductor wafer. The resist layer includes a photo acid generator for use in a subsequent process and the rinse layer includes an acidic component for neutralizing any basic neutralizers that leach from a first portion of the resist and diffuse into a second portion of the resist layer.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. A method, comprising:
   exposing, through an immersion lithography process, a photo-sensitive layer on a substrate;
   thereafter treating the photo-sensitive layer, the treating includes using a solution to neutralize quenchers that have diffused into the photo-sensitive layer, wherein a material composition of the solution is a function of a diffusion rate of the quenchers into the photo-sensitive layer; and
   thereafter removing a portion of the photo-sensitive layer.

2. The method of claim 1, further comprising:
   performing a post-exposure baking process to the photo-sensitive layer after the removing; and
   developing the photo-sensitive layer.

3. The method of claim 1, wherein the immersion lithography process uses a fluid for the exposing, and wherein the quenchers that have diffused into the photo-sensitive layer are diffused through the fluid.

4. The method of claim 1, wherein the removing the portion of the photo-sensitive layer comprises rinsing the photo-sensitive layer with a solvent.

5. The method of claim 1, wherein the portion of the photo-sensitive layer removed is located near an upper surface of the photo-sensitive layer.

6. The method of claim 5, wherein the removing is performed so that about 100 Angstroms of the photo-sensitive layer is removed.

7. The method of claim 1, wherein the removing is performed at least in part using one of: propylene monomethyl and propylene glycol monomethyl etheracetate.

8. The method of claim 1, wherein the solution contains a substance configured to diffuse into the photo-sensitive layer, and wherein the treating the photo-sensitive layer comprises configuring at least one of the following process parameters: a molecular size of the substance, a molecular concentration of the substance, treatment temperature, and treatment pressure.

9. The method of claim 1, wherein the solution contains a photo acid generator (PAG) and a buffer.

10. The method of claim 1, wherein the treating further comprises: spin-drying the photo-sensitive layer.

11. A method, comprising:
    exposing, through an immersion lithography process, a photo-sensitive material on a substrate, the immersion lithography process using a fluid for the exposing;
    thereafter treating the photo-sensitive material with a solution to neutralize quenchers that have diffused into the photo-sensitive material through the liquid, wherein the solution contains a substance that diffuses into the photo-sensitive material at a first rate that is dependent on a second at which the quenchers diffuse into the photo-sensitive material;
    thereafter removing a portion of the photo-sensitive material;
    thereafter performing a post-exposure bake to the photo-sensitive material; and
    developing the photo-sensitive material.

12. The method of claim 11, wherein the treating the photo-sensitive material comprises configuring at least one of the following process parameters: a molecular size of the substance, a molecular concentration of the substance, treatment temperature, and treatment pressure.

13. The method of claim 11, wherein the solution contains a photo acid generator (PAG) and a buffer.

14. The method of claim 11, wherein the treating further comprises: spin-drying the photo-sensitive material.

15. The method of claim 11, wherein the removing the portion of the photo-sensitive material comprises rinsing the photo-sensitive material with at least one of: propylene monomethyl and propylene glycol monomethyl etheracetate.

16. The method of claim 11, wherein the portion of the photo-sensitive material removed is a top portion of the photo-sensitive material.

17. A method, comprising:
 exposing a photoresist on a wafer using an immersion lithography apparatus that contains a fluid for the exposing;
 treating the photoresist, after the exposing, with a solution to neutralize quenchers that have diffused into the photoresist through the liquid, wherein the treating comprises configuring at least one of the following process parameters: a molecular size of a substance, a molecular concentration of the substance, treatment temperature, and treatment pressure, and a diffusion rate of the substance;
 removing, after the treating, an upper portion of the photoresist;
 performing, after the removing, a post-exposure bake to the photoresist; and
 developing the photoresist.

18. The method of claim 17, wherein the solution contains a photo acid generator (PAG) and a buffer.

19. The method of claim 17, wherein the treating further comprises: spin-drying the photoresist.

20. The method of claim 17, wherein the removing the portion of the photoresist comprises rinsing the photoresist with at least one of: propylene monomethyl and propylene glycol monomethyl etheracetate.

* * * * *